United States Patent
Chen et al.

(10) Patent No.: US 7,667,303 B2
(45) Date of Patent: Feb. 23, 2010

(54) MULTI-CHIP PACKAGE

(75) Inventors: Sheng-Hsiung Chen, Kaohsiung (TW); Jen-Te Tseng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/898,950

(22) Filed: Sep. 18, 2007

(65) Prior Publication Data
US 2008/0150098 A1    Jun. 26, 2008

(30) Foreign Application Priority Data
Dec. 20, 2006    (TW) .............................. 95148003 A

(51) Int. Cl.
*H01L 23/495* (2006.01)
(52) U.S. Cl. ...................... 257/666; 438/107
(58) Field of Classification Search ................. 257/686, 257/782, 783, 700, 707, 666, 684; 438/107
See application file for complete search history.

(56) References Cited

U.S. PATENT DOCUMENTS

| | | | | |
|---|---|---|---|---|
| 5,422,435 A * | 6/1995 | Takiar et al. ................. 174/521 |
| 5,552,966 A * | 9/1996 | Nagano ....................... 361/813 |
| 6,215,182 B1 * | 4/2001 | Ozawa et al. ............... 257/723 |
| 6,682,954 B1 * | 1/2004 | Ma et al. ..................... 438/109 |
| 6,897,555 B1 * | 5/2005 | Lim et al. .................... 257/692 |
| 7,009,303 B2 * | 3/2006 | Kuroda et al. ............... 257/777 |
| 7,214,326 B1 * | 5/2007 | Yang et al. .................... 216/13 |
| 2004/0150084 A1 * | 8/2004 | Nishida et al. .............. 257/678 |
| 2005/0093167 A1 * | 5/2005 | Saeki .......................... 257/774 |
| 2005/0248019 A1 * | 11/2005 | Chao et al. .................. 257/686 |

* cited by examiner

*Primary Examiner*—Steven Loke
*Assistant Examiner*—Kimberly M Thomas
(74) *Attorney, Agent, or Firm*—Bacon & Thomas, PLLC

(57) ABSTRACT

A multi-chip package including a carrier, a first chip, a second chip and a first conductive layer is provided. The first chip is disposed on the carrier and is electrically connected to the carrier through at least one first wire. The second chip is disposed on the first chip and is electrically connected to the first chip through at least one second wire. The first conductive layer is disposed on the second chip and is electrically connected to the first chip or the second chip through at least one third wire. The first conductive layer is electrically connected to the carrier through the at least one fourth wire.

15 Claims, 3 Drawing Sheets

MULTI-CHIP PACKAGE

This application claims the benefit of Taiwan application Serial No. 95148003, filed Dec. 20, 2006, the subject matter of which is incorporated herein by reference.

BACKGROUND OF THE INVENTION

1. Field of the Invention

The invention relates in general to a multi-chip package, and more particularly to a multi-chip package using conductive layer as a transfer terminal for wires.

2. Description of the Related Art

The increase in the demand for high density and high efficiency and the cost/benefit concern are a great impetus to the research and development as well as the application of the multi-chip package (MCP). The package module integrates the system with many chips, and can select one or more than one passive element. However, the problem is that when more chips and passive elements are integrated together, the wire bonding becomes more difficult.

For example, under the structure of a quad flat package (QFP), carrying two chips would be enough to cause difficulty in wire bonding. Referring to FIG. 1, a top view and a side view of conventional quad flat package (QFP) are shown. The die pad 10 of the lead frame carries a bottom die 20 and top die 30. The bottom die 20 is electrically connected to the die pad 10 through the first wire L1. The top die 30 is electrically connected to the first chip 20 through the third wire L3 and is connected to the die pad 10 and through the second wire L2. Beside, the die pad 10, the bottom die 20 and the top die 30 are electrically connected to the lead 40 through the fourth wire L4, the fifth wire L5 and the sixth wire L6 respectively.

However, the third wire is easily entangled with neighboring wires or other wire groups, hence incurring short-circuiting. As the layout of wiring is too intensified and against wiring principles, diligence is required when bonding the third wire lest neighboring wires might be damaged or indented. Despite no damage or indent occurs during wire bonding, the problem of wire sweeping is very likely to occur during the subsequent process of sealing the package with a liquid sealant. Wire sweeping leads to short-circuiting and affects the yield rate severely. Besides, if the position of the die is shifted such that one wire contact with each other, the likelihood of short-circuiting is still reduced. The above factors affect the yield rate to a great extent. Therefore, how to work out an efficient solution capable of resolving the wire bonding problem occurring when many chips are passive elements are integrated in the same package has become an imminent issue to be resolved in the industry of multi-chip package.

SUMMARY OF THE INVENTION

The invention is directed to a multi-chip package which assembles the wires between the chips or between the chips and the carrier. By using a conductive layer as a transfer terminal, the complicated wires are connected to the external through the transfer terminal, avoiding short-circuiting which may arise if wires are entangled or swept.

According to a first aspect of the present invention, a multi-chip package including a carrier, a first chip, a second chip and a first conductive layer is provided. The first chip is disposed on the carrier and is electrically connected to the carrier through at least one first wire. The second chip is disposed on the first chip and is electrically connected to the first chip through at least one second wire. The first conductive layer is disposed on the second chip and is electrically connected to the first chip or the second chip through at least one third wire. The first conductive layer is electrically connected to the carrier through the at least one fourth wire.

The invention will become apparent from the following detailed description of the preferred but non-limiting embodiments. The following description is made with reference to the accompanying drawings.

DETAILED DESCRIPTION OF THE INVENTION

Figure 1:
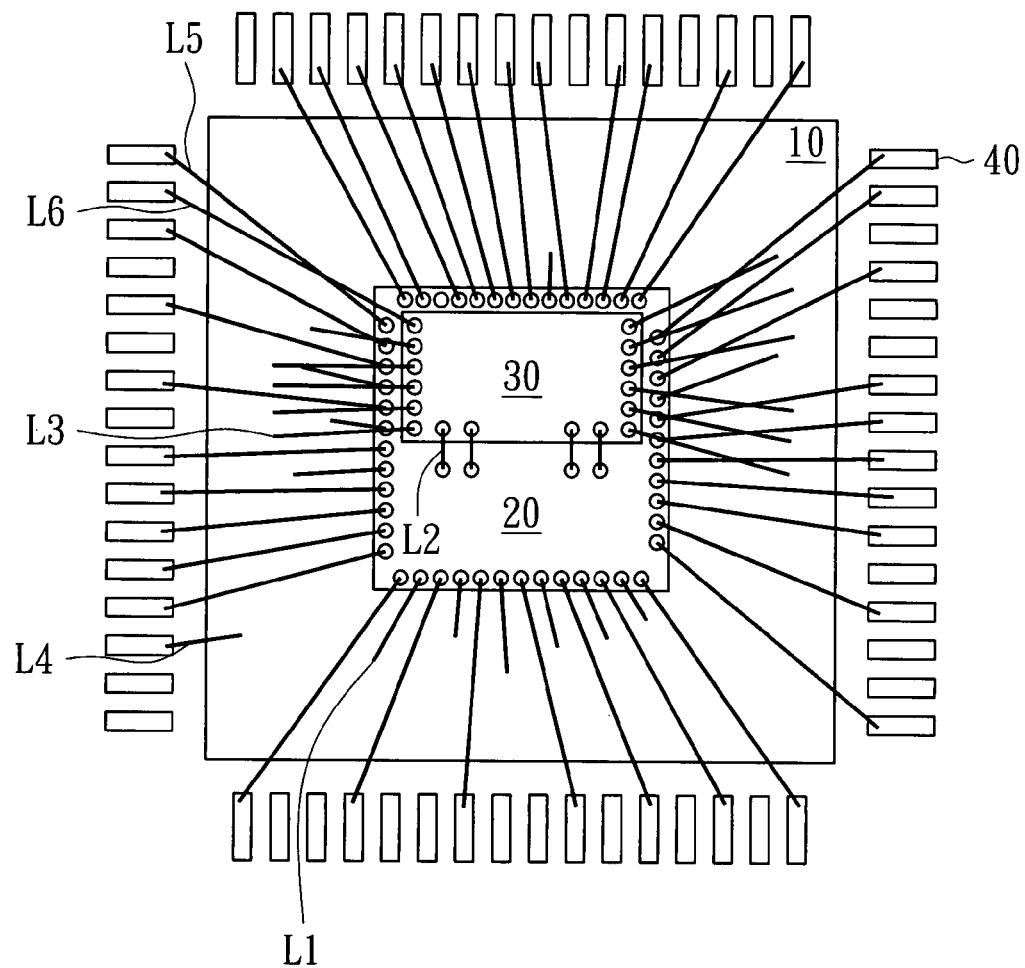
FIG. 1 (Prior Art) are a top view and a side view of conventional quad flat package (QFP)
Figure 1:
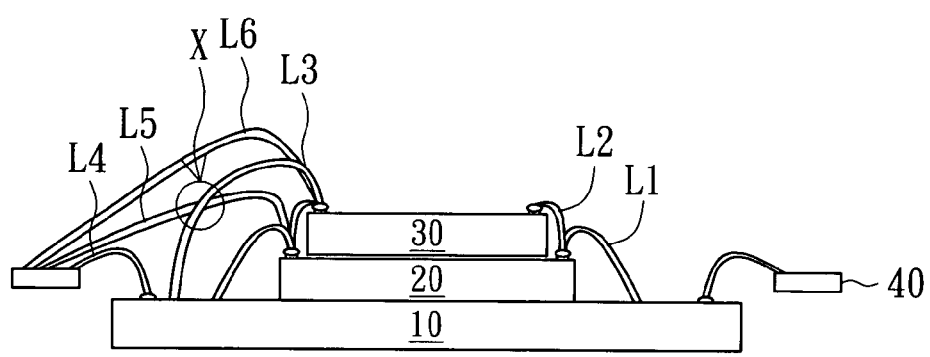

The invention is directed to a multi-chip package in which the contacts on the chip assemble to a conductive layer first and then are transferred to a target region (such as a grounding region or a power region) on the carrier. The multi-chip package of the invention includes a carrier, a first chip, a second chip and a first conductive layer. The first chip is disposed on the carrier and is electrically connected to the carrier through at least one first wire. The second chip is disposed on the first chip and is electrically connected to the first chip through at least one second wire. The first conductive layer is disposed on the second chip and is electrically connected to the first chip or the second chip through at least one third wire. The first conductive layer is electrically connected to the carrier through at least one fourth wire.

The above practice can be used in different applications or different package structures. A number of embodiments accompanied by drawings are disclosed below. However, anyone who is skilled in the technology of the invention will understand that the embodiments below are examples under the spirit of the invention and are not for limiting the scope of protection of the invention.

First Embodiment

The present embodiment of the invention is exemplified a quad flat package (QFP). The multi-chip package 100 includes a carrier 101, a first chip 120, a second chip 130 and a first conductive layer 140. Of the quad flat package, the carrier 101 is a lead frame comprising a die pad 110 and a plurality of leads 150; the first chip 120 is disposed on the die pad 110 and is electrically connected to the die pad 110 through the first wire L1; the second chip 130 is disposed on the first chip 120 and is electrically connected to the first chip 120 through the second wire L2.

The first conductive layer 140 is disposed on the second chip 130. The multi-chip package 100 preferably includes an insulating layer 142 disposed between the first conductive layer 140 and the second chip 130. Preferably, a number of conductive protrusions 148 are formed on the first conductive layer 140 for electrically connecting the third wire L3 to the fourth wire L4. These conductive protrusions 148 are made of gold or other alloy.

The first conductive layer 140 preferably comprises aluminum. The first conductive layer 140 can be formed in different ways. For example, the first conductive layer 140 can be a metal plate disposed on the second chip 130 or a metal plated layer electroplated on the surface of the second chip 130. Or, the first conductive layer 140 can be a dummy die disposed in the multi-chip package 100. For example, the multi-chip package 100 further includes a dummy die disposed on the second chip 130, wherein the dummy die includes a silicon body and the first conductive layer 140 formed on the silicon body.

Figure 2:
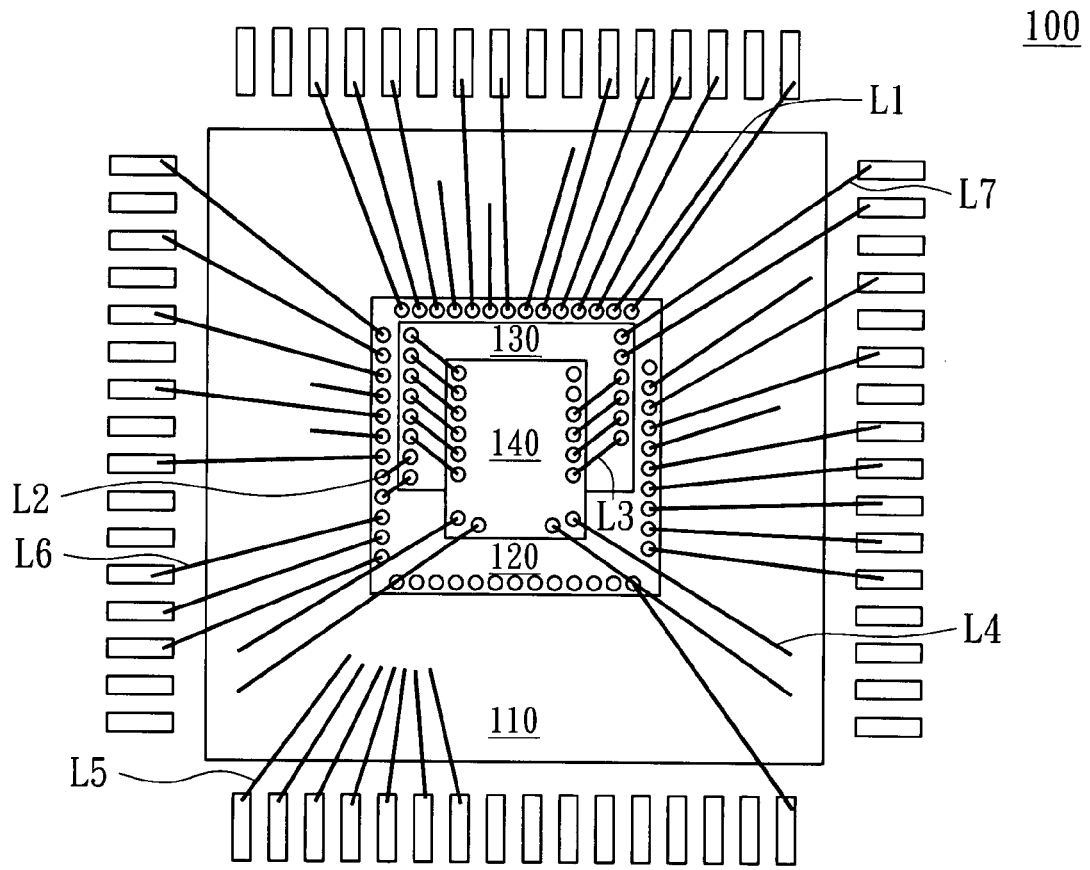
FIG. 2 are a top view and a side view of a multi-chip package according to a first embodiment of the invention.
Figure 2:
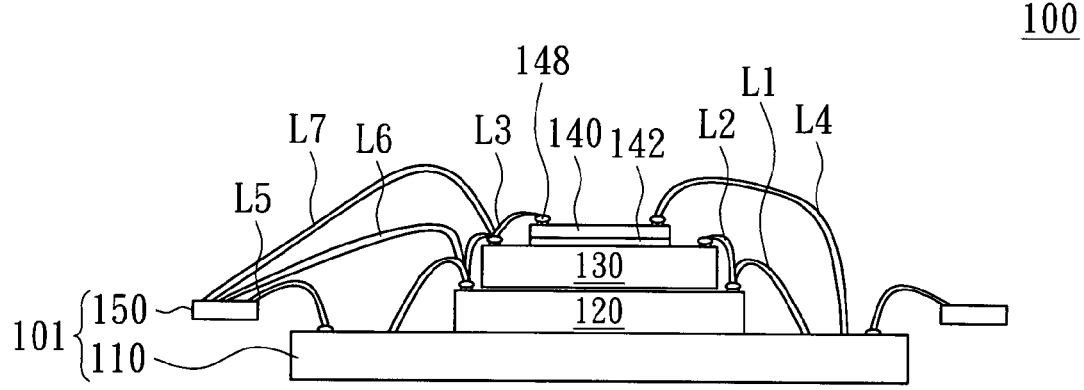

The first conductive layer 140 is electrically connected to the first chip 120 or the second chip 130 through the third wire L3. As indicated in FIG. 2, the first conductive layer 140 of the present embodiment of the invention is electrically connected to the second chip 130 through the third wire L3. The first conductive layer 140 is electrically connected to the die pad 110 through the fourth wire L4.

Likewise, the die pad 110, the first chip 120 and the second chip 130 are electrically connected to the leads 150 through the fifth wire L5, the sixth wire L6 and the seventh wire L7, respectively.

It is noted that the second chip 130 is not directly connected to the die pad 110 through only one wire. Rather, but the second chip 130 is electrically connected to the first conductive layer 140 through the third wire L3 first, and then electrically connected to the die pad 110 through the fourth wire L4. Accordingly, a number of contacts disposed on the first chip 120 and the second chip 130 are able to assembled on the first conductive layer 140 first, and are connected to the die pad 110 to be grounded next, hence avoiding wire entangling and short-circuiting.

Second Embodiment

The design of the conductive layer and wire according to the multi-chip package of the invention is not only applicable to the quad flat package for resolving the wire entangling and wire short-circuiting problem, but is also applicable to other package structures.

Figure 3:
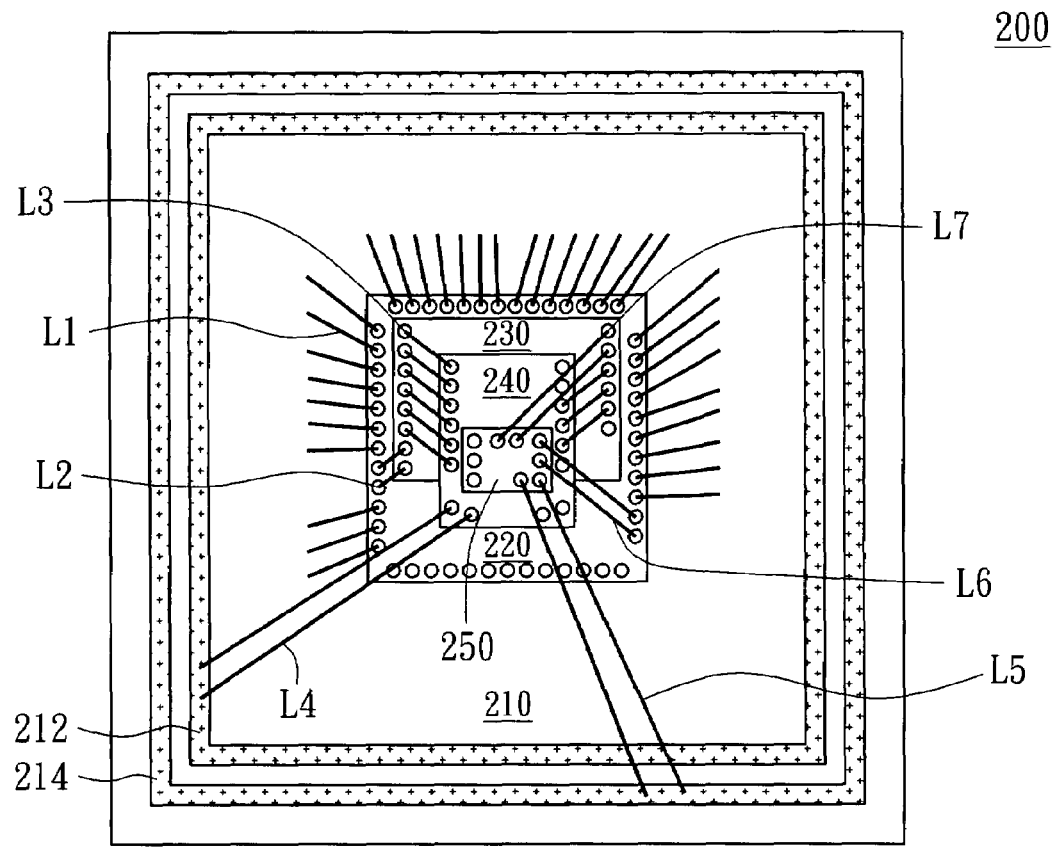
FIG. 3 a top view and a side view of a multi-chip package according to a second embodiment of the invention.
Figure 3:
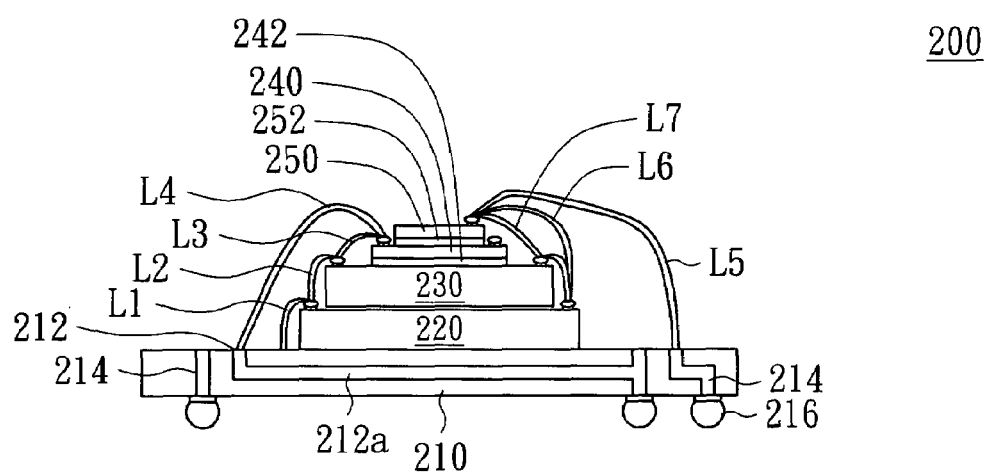

Referring to FIG. 3, a top view and a side view of a multi-chip package according to a second embodiment of the invention are shown. The present embodiment of the invention is exemplified by a ball grid array (BGA) package. The multi-chip package 200 includes a carrier 210, a first chip 220, a second chip 230 and a first conductive layer 240. For example, the carrier is a substrate. The substrate has a grounding layer 212a connected to a grounding region 212 disposed on an upper surface of the substrate. The grounding region 212 normally forms a ring. The first chip 220 is disposed on the carrier 210 and is electrically connected to the carrier 210 through the first wire L1. The second chip 230 is disposed on the first chip 220 and is electrically connected to the first chip 210 through the second wire L2.

The first conductive layer 240 is disposed on the second chip 230. The multi-chip package 200 preferably includes an insulating layer 242 disposed between the first conductive layer 240 and the second chip 230.

The first conductive layer 240 preferably comprises aluminum. The first conductive layer 240 can be formed in many ways. For example, the first conductive layer 240 can be a metal plate disposed on the second chip 230 or a metal plated layer electroplated on the surface of the second chip 230. Or, the first conductive layer 240 can be a dummy die disposed in the multi-chip package 200. For example, the multi-chip package 200 further includes a dummy die disposed on the second chip 230, wherein the dummy die includes a silicon body and the first conductive layer 240 formed on the silicon body.

The first conductive layer 240 is electrically connected to the first chip 220 or the second chip 230 through the third wire L3. As indicated in FIG. 3, the first conductive layer 240 of the present embodiment of the invention is electrically connected to the second chip 230 through the third wire L3. The first conductive layer 240 is electrically connected to the carrier 210 through the fourth wire L4. Preferably, the first conductive layer 240 is connected to the grounding region 212 of the carrier 210 through the fourth wire.

It is noted that the second chip 230 is not directly connected to the carrier 210 through only one wire. Rather, the second chip 230 is electrically connected to the first conductive layer 240 through the third wire L3 first and then is electrically connected to the grounding region 212 through the fourth wire L4 next. Thus, a number of contacts on the first chip 220 and the second chip 230 for connecting a grounding source are assembled on the first conductive layer 240 first, and together are connected to the grounding region 212 of the carrier next.

Furthermore, the multi-chip package 200 may use one or more than one conductive layer as a transfer terminal for electrical contacts. For example, the multi-chip package 200 further includes a second insulating layer 252 and a second conductive layer 250. The second insulating layer 252 is disposed on the surface of the first conductive layer 240. The second conductive layer 250 is disposed on the second insulating layer 252 and is electrically connected to the power region of the carrier 210 through at least one fifth wire L5. The second conductive layer 250 is electrically connected to the first chip 220 through at least one sixth wire L6. Or, the second conductive layer 250 is electrically connected to the second chip 230 through at least one seventh wire L7.

Preferably, the second conductive layer 250 is electrically connected to a power region 214 of the carrier 210 through the fifth wire L5. The second chip 230 is not directly connected to the power region 214 of the carrier 210 through the wire, but is electrically connect to the second conductive layer 250 through the seventh wire L7 first, and then is electrically connected the power region 214 through the fifth wire L5. Thus, the contacts disposed on the first chip 220 and the second chip 230 for connecting a power source are assembled on the second conductive layer 250 first, together connected to the power region 214 of the carrier next, and are connected to a power circuit through a solder ball 216 lastly.

As the layout of wiring is too dense and against wiring principles, it must beware of wire entanglement with or damage to the neighboring wires when bonding the third wire. Despite no damage or wire entanglement occurs during wire bonding, the problem of wire sweeping is very likely to occur during the subsequent process of sealing the package with a liquid sealant. It leads to short-circuiting and affects the yield rate severely.

According to the multi-chip package disclosed in the above embodiments of the invention, a number of contacts on the chip are assembled on a conductive layer first, and then are connected to a target region (such as a grounding region or a power region) on the carrier next. The above design has the following advantages.

(1) The bonding process complies with the wiring principles. The complicated wires between the chips or between the chips and the carrier are assembled first, and then are connected to the external through a conductive layer used as a transfer terminal, avoiding wire entangling and wire sweeping which may end up with short-circuiting.

(2) The area for wire bonding provided by the conductive layer is greater than the peripheral of the chip, so the design is more flexible. For example, the inter-space between the wires can be appropriately adjusted and increased; or, the wires can be moved to an area with a lower density of distribution for easing wire entangling and wire sweeping so that the occurrence of short circuit is reduced. And the likelihood of short-circuiting due to the wires contact with each other is still reduced even if the position of the die is shifted.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-chip package, comprising:
   a carrier having a region thereof;
   a first chip disposed on the carrier and electrically connected to the carrier through at least one first wire, the first chip comprising at least two contacts thereon;
   a second chip disposed on the first chip and electrically connected to the first chip through at least one second wire, the second chip comprising at least two contacts thereon; and
   a first conductive layer disposed on the second chip and electrically connected to at least two contacts on the second chip through at least two third wires, wherein the two third wires connect two contacts of the second chip to the first conductive layer so as to allow the two contacts on the second chip to be electrically connected;
   wherein at least one fourth wire connects the first conductive layer and the region of the carrier, one end of the fourth wire in contact with the first conductive layer and the other end of the fourth wire in contact with the region of the carrier layer, so as to allow the two contacts on the second chip, the first conductive layer and the region of the carrier are electrically connected.

2. The multi-chip package according to claim 1, wherein the region of the carrier is a grounding region.

3. The multi-chip package according to claim 2, wherein the fourth wire connects the first conductive layer and the grounding region of the carrier.

4. The multi-chip package according to claim 1 further comprising:
   a first insulating layer disposed on the surface of the first conductive layer;
   a first conductive layer disposed on the second insulating layer and electrically connected to a power region of the carrier through at least one fifth wire.

5. The multi-chip package according to claim 1 further comprising a first insulating layer disposed between the first conductive layer and the second chip.

6. The multi-chip package according to claim 1 further comprising a plurality of conductive protrusions formed on the first conductive layer for electrically connecting the third wire and the fourth wire.

7. The multi-chip package according to claim 6, wherein the conductive protrusions are made of gold or other alloy.

8. The multi-chip package according to claim 1, wherein the first conductive layer is a metal plate.

9. The multi-chip package according to claim 1, wherein the first conductive layer is a metal plated layer.

10. The multi-chip package according to claim 1, wherein the first conductive layer comprises aluminum.

11. The multi-chip package according to claim 1 further comprising:
    a dummy die disposed on the second chip and comprising a silicon body and the first conductive layer, wherein the first conductive layer is formed on the silicon body.

12. The multi-chip package according to claim 11, wherein a second conductive layer is electrically connected to the first chip through at least one fifth wire.

13. The multi-chip package according to claim 11, wherein a second conductive layer is electrically connected to the second chip through at least one fifth wire.

14. The multi-chip package according to claim 1, wherein the carrier is a substrate and a grounding layer is disposed inside the substrate and the first conductive layer connected to the grounding region connected to the grounding region disposed on an upper surface of the substrate.

15. The multi-chip package according to claim 1, wherein the carrier is a lead frame.

* * * * *